(12) United States Patent
Ikeda (10) Patent No.: US 7,002,875 B2
(45) Date of Patent: Feb. 21, 2006

(54) SEMICONDUCTOR MEMORY (75) Inventor: Hitoshi Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/997,881

(22) Filed: Nov. 29, 2004

(65) Prior Publication Data
US 2005/0281129 A1   Dec. 22, 2005

(30) Foreign Application Priority Data
May 20, 2004  (JP) ............................. 2004-150561

(51) Int. Cl.
*G11C 8/00* (2006.01)

(52) U.S. Cl. ................................. 365/233; 365/189.05
(58) Field of Classification Search ................ 365/233, 365/189.05, 194, 222
See application file for complete search history.

(56) References Cited

U.S. PATENT DOCUMENTS 6,249,483 B1 * 6/2001 Kim ........................... 365/233
6,256,260 B1 * 7/2001 Shim et al. ................. 365/233
6,385,127 B1 * 5/2002 Ikeda ......................... 365/233

FOREIGN PATENT DOCUMENTS

JP          10-55665          2/1998

* cited by examiner

*Primary Examiner*—Anh Phung
(74) *Attorney, Agent, or Firm*—Arent Fox PLLC (57) ABSTRACT A latch signal generator generates a latch signal in synchronization with later one of a timing at which a delayed chip enable signal obtained by delaying a chip enable signal is activated and a transition timing of a clock signal. A latch circuit latches an input signal received by a signal input buffer, in synchronization with the latch signal. By changing the timing the latch signal is generated in accordance with set-up time of the input signal with respect to the clock signal, it is possible to reduce the stand-by current and prevent malfunction of a semiconductor memory caused by improper latch of the input signal.

4 Claims, 8 Drawing Sheets

SEMICONDUCTOR MEMORY

CROSS-REFERENCE TO RELATED APPLICATION

This application is based upon and claims the benefit of priority Japanese Patent Application No. 2004-150561, filed on May 20, 2004, the entire contents of which are incorporated herein by reference.

BACKGROUND OF THE INVENTION

1. Field of the Invention

The present invention relates to a semiconductor memory that operates in synchronization with a clock signal.

2. Description of the Related Art

As a semiconductor memory that operates in synchronization with a clock signal, a synchronous DRAM is known, for example. This type of semiconductor memory transmits an input signal (e.g., address signal) received by an input circuit to a latch circuit during a period in which a chip enable signal is active, and latches the transmitted signal in synchronization with a clock signal. The latched signal is supplied to a decoder and the like.

A system for accessing the semiconductor memory supplies the input signal and the chip enable signal to the semiconductor memory in synchronization with the clock signal. For example, Japanese Unexamined Patent Application Publication No. 10-55665 describes that, in order to surely latch the address signal in synchronization with the clock signal, an operation margin of an internal circuit of the semiconductor memory is used to make the period in which the chip enable signal is active longer than a valid period of the input signal.

On the other hand, a pseudo SRAM, a pseudo DRAM or the like, is known as a semiconductor memory that is not synchronized with a clock signal. This type of semiconductor memory controls an input circuit for receiving an input signal such as an address signal, by a chip enable signal in order to reduce a stand-by current. In other words, the stand-by current is reduced by activating the input circuit only during a period in which the chip enable signal is active. The input signal received by the input circuit is latched by a signal obtained by delaying the chip enable signal, and is then supplied to a decoder and the like.

SUMMARY OF THE INVENTION

It is an object of the present invention to provide a clock synchronization-type semiconductor memory in which an input circuit for an input signal is controlled by a chip enable signal and which can surely latch the input signal received by the input circuit by a latch circuit.

In a semiconductor memory according to one aspect of the present invention, a clock input buffer receives a clock signal for operating an internal circuit. An enable input buffer receives a chip enable signal for enabling a memory core to operate. A signal input buffer is activated and receives an input signal while the chip enable signal is active. The signal input buffer is deactivated so as to stop its operation while the chip enable signal is not active. By activating the signal input buffer only while the chip enable signal is active, a stand-by current is reduced. A latch signal generator generates a latch signal in synchronization with later one of a timing at which a delayed chip enable signal obtained by delaying the chip enable signal is activated and a transition timing of the clock signal received by the clock input buffer. A latch circuit latches the input signal received by the signal input buffer in synchronization with the latch signal.

According to the above structure, in a case where set-up time of the input signal with respect to the clock signal is long, the input signal is latched in synchronization with the clock signal. In a case where the set-up time of the input signal with respect to the clock signal is short, the input signal is latched in synchronization with the delayed chip enable signal that is not synchronized with the clock signal. Thus, the input signal can be surely latched without increasing the stand-by current. In other words, in a clock synchronization-type semiconductor memory in which the signal input buffer is controlled by the chip enable signal in order to reduce the stand-by current, the input signal can be surely latched even if the set-up time of the input signal with respect to the clock signal is short. Thus, it is possible to reduce the stand-by current and prevent malfunction of the semiconductor memory caused by improper latch of the input signal that may be caused by insufficient set-up.

In a preferred example of the semiconductor memory according to one aspect of the present invention, the signal input buffer is an address input buffer that receives an address signal indicating the memory cell to be accessed. In general, the address signal is supplied to a plurality of other devices in common in a system including the semiconductor memory. Thus, a load on a signal line for transmitting the address signal in the system becomes large. Therefore, a timing of arrival to the semiconductor memory of the address signal becomes later than that of the chip enable signal. By applying the present invention, even in a case where the load on the address signal line is large and therefore the address signal is transmitted later than the chip enable signal, the input signal can be surely latched, thus preventing malfunction.

In a preferred example of the semiconductor memory according to one aspect of the present invention, a command input buffer receives an access request for making an access to the memory core. A command decoder receives the access request received by the command input buffer in synchronization with the latch signal, decodes that access request, and outputs an operation control signal for operating the memory core. A core control circuit accesses the memory core in response to the decoding result (the operation control signal) of the command decoder.

In the case where set-up time of the chip enable signal with respect to the clock signal is short and the address signal is latched in synchronization with the delayed chip enable signal, the latch timing of the address signal is later than that in the case where the address signal is latched in synchronization with the clock signal. In this case, the command decoder outputs the operation control signal in synchronization with the latch signal generated in accordance with the delayed chip enable signal. Similarly, in a case where the set-up time of the chip enable signal with respect to the clock signal is long and the address signal is latched in synchronization with the clock signal, the operation control signal is output in synchronization with the clock signal. In this manner, the operation timing of the command decoder is changed in accordance with the latch timing of the address signal. Thus, it is possible to make the timing the address signal is supplied to the memory core to coincide with the timing that the operation of the memory core starts. Therefore, malfunction of the memory core caused by an improper address signal can be prevented.

In a preferred example of the semiconductor memory according to one aspect of the present invention, a refresh timer generates a refresh request for refreshing the memory cell in a predetermined cycle. A refresh counter sequentially generates a refresh address signal that indicates the memory cell to be refreshed, in synchronization with the refresh request. An arbiter determines, when the access request and the refresh request compete, which one of them is to be put before the other. Thus, a refresh operation is automatically performed without being recognized from the outside of the semiconductor memory. Therefore, in a clock synchronization-type semiconductor memory that automatically performs the refresh operation (e.g., a pseudo SRAM), the input signal can be surely latched without increasing the stand-by current, thus preventing malfunction.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

The present invention was made in order to solve the following problems.

In a clock synchronization-type semiconductor memory, the frequency of a clock signal tends to become higher. This has made it difficult to ensure operation margin of an internal circuit of the semiconductor memory. Therefore, when the frequency of the clock signal (operating frequency) is high, an address signal cannot be surely latched in synchronization with the clock signal even if the method described in the above Japanese Unexamined Patent Application Publication is used.

Moreover, a clock synchronization-type pseudo SRAM has been proposed recently. In this pseudo SRAM, in a case where an input circuit for an address signal is controlled by a chip enable signal and the address signal is latched in synchronization with a clock signal, as in the clock synchronization-type semiconductor memory, the address signal is not properly latched when set-up time of the chip enable signal with respect to the clock signal is short. In other words, the set-up time in the latch circuit becomes shorter by the amount corresponding to delay of the address signal in the input circuit caused by the chip enable signal, so that latch margin in the latch circuit is reduced.

In addition, in a system for accessing a semiconductor memory, the address signal is generally supplied to a plurality of devices in common. Thus, the wiring length in the system becomes long and the load on the wiring also increases. Therefore, the address signal arrives at the semiconductor memory later than the chip enable signal in many cases. In this manner, the load on the signal line in the system also contributes to reduction of the set-up time in the latch circuit. The set-up time and the hold time become shorter as the frequency of the clock signal is higher. Thus, the aforementioned problem is more apparent as the frequency of the clock signal is higher.

On the other hand, in the clock synchronization-type pseudo SRAM, a case is considered where the address signal received by the input circuit is latched by a delayed signal obtained by delaying the chip enable signal as in a clock non-synchronization-type pseudo SRAM. In this case, when the frequency of the clock signal is changed, the address signal cannot be properly latched. More specifically, a generation timing of the aforementioned delayed signal does not depend on a cycle of the clock. Therefore, the change of the clock cycle changes the latch timing.

Hereinafter, an embodiment of the present invention will be described with reference to the drawings. In the drawings, a signal line shown with bold line is formed by a plurality of bits, and a double circle represents an external terminal (corresponding to a pad on a chip). A signal including "Z" at the end of its signal name represents a positive logic, whereas a signal including "/" at the top of its name and a signal including "X" at the end of its name represent negative logics.

Figure 1:
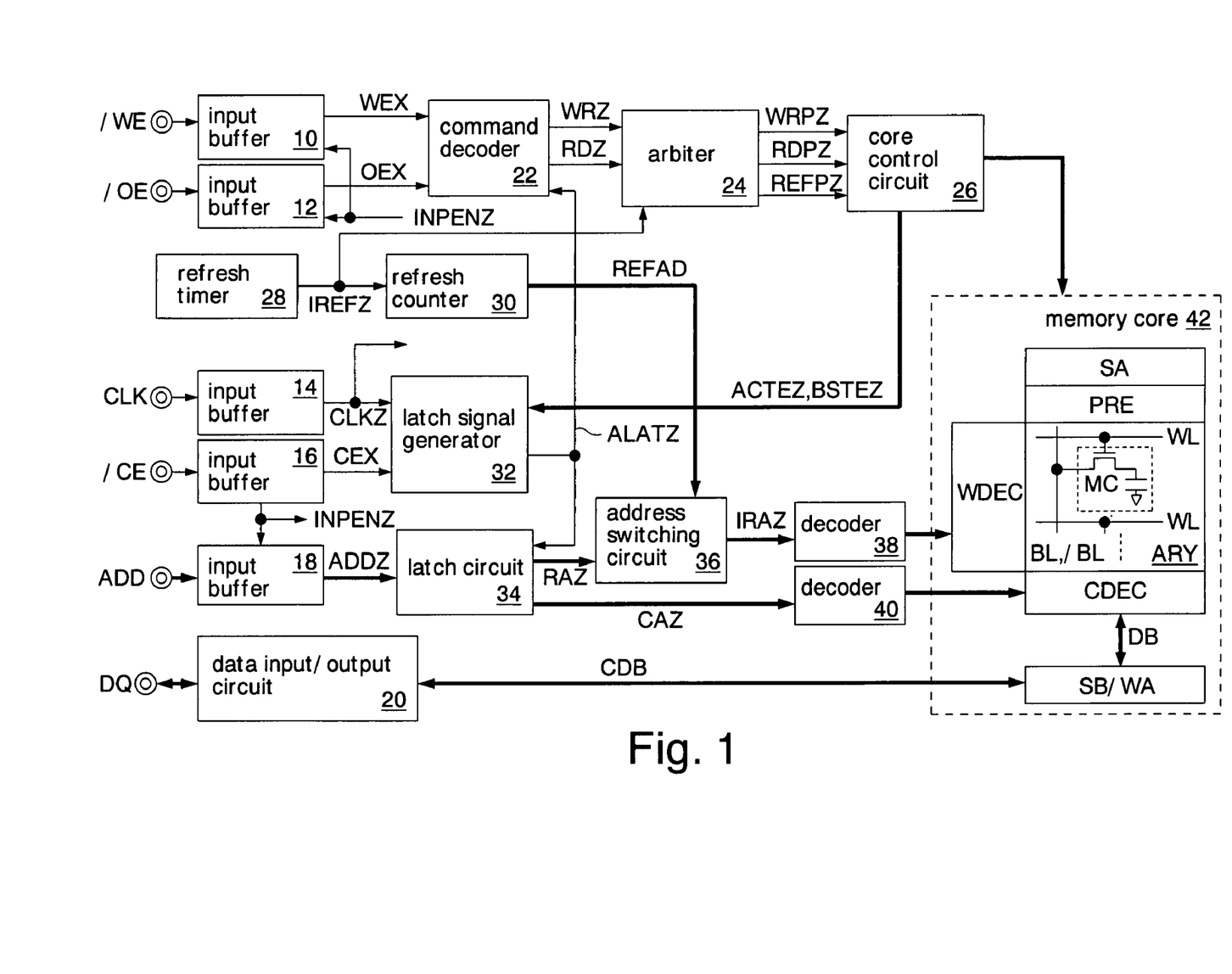
FIG. 1 is a block diagram of an embodiment of a semiconductor memory according to the present invention.

FIG. 1 shows an embodiment of a semiconductor memory according to the present invention. This semiconductor memory is formed as a clock synchronization-type pseudo SRAM chip (device) that includes DRAM memory cells (dynamic memory cells) and an SRAM interface. The pseudo SRAM periodically performs a refresh operation within the chip without receiving a refresh command from the outside, and holds data that has been written in the memory cells.

The pseudo SRAM includes: input buffers 10, 12, 14, 16, and 18 for receiving a write enable signal /WE, an output enable signal /OE, a clock signal CLK, a chip enable signal /CE, and an address signal ADD, respectively, a data input and output circuit 20, a command decoder 22, an arbiter 24, a core control circuit 26, a refresh timer 28, a refresh counter 30, a latch signal generator 32, a latch circuit 34, an address switching circuit 36, a row decoder 38, a column decoder 40, and a memory core 42.

The input buffer 14 is always active and outputs the clock signal CLK as an internal clock signal CLKZ. The input buffer 14 operates as a clock input buffer that receives the clock signal CLK for causing the internal circuit to operate. The internal clock signal CLKZ is supplied to a main part in the pseudo SRAM. The input buffer 16 is always active and outputs the chip enable signal /CE as an internal chip enable signal CEX and an input enable signal INPENZ. The input enable signal INPENZ has a logic obtained by inverting a logic of the chip enable signal /CE. The input buffer 16 operates as an enable input buffer that receives the chip enable signal /CE for enabling the memory core 42. Please note that the chip enable signal is also called as a chip select signal and is used for selecting a pseudo SRAM assigned on an address map of a system.

The input buffer 10 is activated during an active period of the input enable signal INPENZ and outputs the write enable signal /WE as an internal write enable signal WEX. The input buffer 12 is activated during the active period of the input enable signal INPENZ and outputs the output enable signal /OE as an internal output enable signal OEX. The write enable signal /WE and the output enable signal /OE are access request signals for causing the memory core 42 to perform a write operation and a read operation, respectively. The input buffers 10 and 12 operate as command input buffers that respectively receive the access requests (write request and read request) for accessing to the memory core 42, respectively.

The input buffer 18 is activated during the active period of the input enable signal INPENZ, receives the address signal ADD indicating a memory cell MC to be accessed, and outputs the received signal as an internal address signal ADDZ. The input buffer 18 operates as a signal input buffer (address input buffer), which is activated in order to receive the address signal while the chip enable signal /CE is active and is deactivated so as to stop an operation for receiving the address signal while the chip enable signal /CE is not active. Since the input buffers 10, 12, and 18 are deactivated during a non-active period of the input enable signal INPENZ, leak currents in the input buffers 10, 12, and 18 (feedthrough currents between power supplies) can be reduced during a stand-by period. Moreover, the circuits in the pseudo SRAM do not operate even if the input signal is changed. Thus, a stand-by current can be reduced.

The data input and output circuit 20 includes an output buffer and an input buffer that are not shown in the drawings. The output buffer receives data read from the memory cell MC via a common data bus CDB during the read operation and outputs the received data to a data terminal DQ. The output buffer operates in synchronization with a timing signal generated by using the internal output enable signal OEX and the internal clock signal CLKZ. The input buffer receives data to be written via the data terminal DQ during the write operation and outputs the received data to the common data bus CDB. The input buffer operates in synchronization with a timing signal generated by using the internal write enable signal WEX and the internal clock signal CLKZ.

The command decoder 22 receives the internal write enable signal WEX (command signal) and the internal output enable signal OEX (command signal) in synchronization with an address latch signal ALATZ and, decodes the received signals. The command decoder 22 activates a write control signal WRZ for performing a write operation when the internal write enable signal WEX is low, and outputs a read control signal RDZ for performing a read operation when the internal output enable signal OEX is low. The write control signal WRZ and the read control signal RDZ are operation control signals for operating the memory cell 42.

The arbiter 24 compares transition edges of the control signals RDZ and WRZ (external access request) and an internal refresh request signal IREFZ (refresh request) so as to determine whether or not the control signals RDZ and WRZ and the internal refresh request signal IREFZ compete, and then determines which one of the access operation (external access operation) and the refresh operation (internal access operation) is put before the other. In the case where the access operation is put before the refresh operation, the arbiter 24 temporarily holds the refresh request and outputs a read timing signal RDPZ or a write timing signal WRPZ in response to the access request. Then, the arbiter 24 outputs a refresh timing signal REFPZ in accordance with the refresh request the arbiter 24 holds, in response to completion of the access operation of the memory core 42 corresponding to the timing signal RDPZ or WRPZ.

In the case where the refresh operation is put before the access operation, the arbiter 24 temporarily holds the access request, and outputs the refresh timing signal REFPZ in response to the refresh request. Then, the arbiter 24 outputs the read timing signal RDPZ or the write timing signal WRPZ in accordance with the access request that the arbiter 24 holds, in response to completion of the access operation of the memory core 42 corresponding to the refresh request.

The core control circuit 26 outputs a timing signal for operating the memory core 42 (a word line activating signal, a sense amplifier activating signal, a bit line reset signal, and the like) when receiving the read timing signal RDPZ, the write timing signal WRPZ, or the refresh timing signal REFPZ. The core control circuit 26 outputs an active end signal ACTEZ or a burst end signal BSTEZ in synchronization with the completion of the access operation of the memory core 42. The burst end signal BSTEZ is output at the time of completion of a burst operation in which data is input to or output from the memory core 42 more than once in response to a single external access request.

The refresh timer 28 outputs an internal refresh request signal IREFZ for refreshing the memory cell MC, in a predetermined cycle. The refresh timer 28 includes a ring oscillator for generating an oscillation signal and a frequency divider for generating the internal refresh request signal IREFZ from the output of the ring oscillator, for example. The refresh counter 30 performs a count operation in synchronization with the internal refresh request signal IREFZ, so as to sequentially generate a refresh address signal REFAD indicating a memory cell MC to be refreshed.

The latch signal generator 32 generates an address latch signal ALATZ for latching the internal address signal ADDZ, using the internal clock signal CLKZ, the internal chip enable signal CEX, the active end signal ACTEZ, and the burst end signal BSTEZ. The latch signal generator 32 generates the address latch signal ALATZ in synchronization with later one of a timing at which a delayed chip enable signal (node ND3 in FIG. 2 described later) obtained by delaying the chip enable signal /CE is activated and a transition timing of the internal clock signal CLKZ (node ND2 in FIG. 2). The address latch signal ALATZ is also used as a decoding timing signal for the command decoder 24.

The latch circuit 34 latches the internal address signal ADDZ in synchronization with the address latch signal ALATZ and outputs the latched address as a row address signal RAZ (higher-order bits of the address) and a column address signal CAZ (lower-order bits of the address). The row address signal RAZ is used for selecting a word line WL. The column address signal CAZ is used for selecting a bit line BL (or /BL).

The address switching circuit 36 outputs the refresh address signal REFAD as a row address signal IRAZ when the memory core 42 performs a refresh operation and outputs the row address signal RAZ as the row address signal IRAZ when the memory core 42 performs a read operation or a write operation. The switching operation of the address switching circuit 36 is performed in response to a switching signal (not shown) from the core control circuit.

The row decoder 38 decodes the row address signal IRAZ to generate a row address decoded signal, and supplies the thus generated signal to a word decoder part WDEC. The column decoder 40 decodes the column address signal CAZ to generate a column address decoded signal, and supplies the thus generated signal to a column decoder part CDEC.

The memory core 42 includes a memory array ARY, the word decoder part WDEC, a sense amplifier part SA, a precharging part PRE, the column decoder part CDEC, a sense buffer part SB, and a write amplifier part WA. The memory array ARY includes a plurality of volatile memory cells MC (dynamic memory cells), a plurality of word lines WL and a plurality of BL and /BL (complementary bit lines) that are connected to the memory cells MC. Each memory cell MC is the same as a typical DRAM memory cell, and includes a capacitor for holding data as electric charges and a transfer transistor arranged between that capacitor and the bit line BL (or /BL). The gate of the transfer transistor is connected to the word line WL. By selecting the word line WL, any of a read operation, write operation and refresh operation is performed. After any of the read operation, write operation, and refresh operation is performed, the memory array ARY performs a precharge operation for precharging the bit lines BL and /BL to have a predetermined voltage, in response to a bit line reset signal from the core control circuit 26.

The word decoder part WDEC selects one of the word lines WL in synchronization with a word line activating signal from the core control circuit 26 and changes the level of the selected word line WL to a high level. The column decoder part CDEC outputs a column line signal for turning on a column switch (not shown) that connects the bit line BL or /BL to the data bus DB in accordance with the column address signal CAD.

The sense amplifier part SA includes a plurality of sense amplifiers. Each sense amplifier operates in response to a sense amplifier activating signal from the core control circuit 26 and amplifies the magnitude of the signal of the data on the bit line BL or /BL. The data amplified by the sense amplifier is transmitted to the data bus DB via the column switch during the read operation, and is written onto a memory cell MC via a bit line during the write operation. The precharging part PRE includes a plurality of precharging circuits respectively connected to pairs of the bit lines BL and /BL. Each precharging circuit precharges the bit line BL or /BL to have a predetermined voltage in response to the bit line reset signal.

The sense buffer part SB amplifies the magnitude of the signal of the read data on the data bus DB and outputs that data to the common data bus CDB. The write amplifier part WA amplifies the magnitude of the signal of the write data on the common data bus CDB and outputs that data to the data bus DB.

Figure 2:
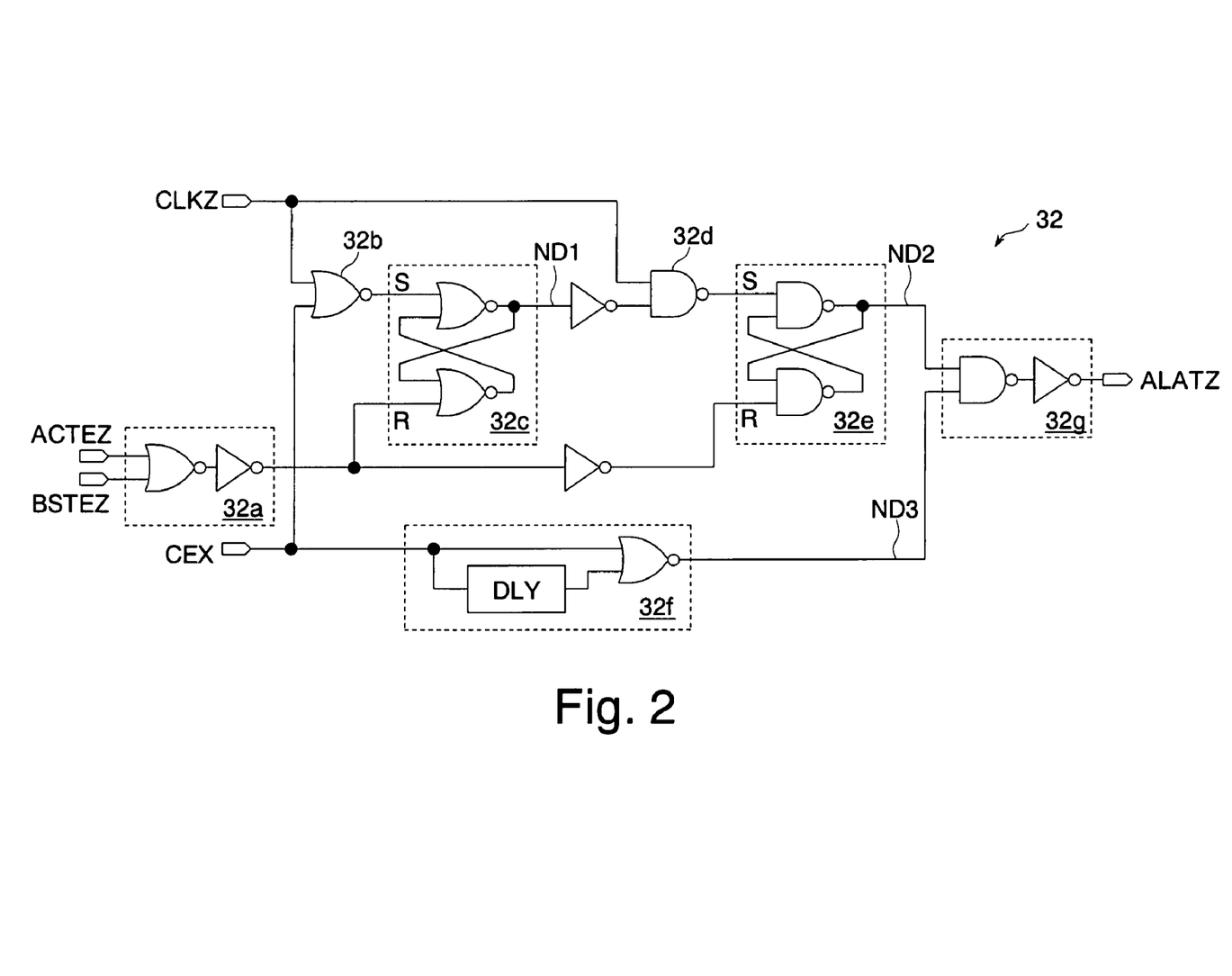
FIG. 2 is a circuit diagram showing details of a latch signal generator shown in FIG. 1.

FIG. 2 shows details of the latch signal generator 32 shown in FIG. 1. The latch signal generator 32 includes an OR circuit 32a, a NOR gate 32b, a flip-flop 32c, a NAND gate 32d, a flip-flop 32e, a timing generator 32f, and an AND circuit 32g.

The OR circuit 32a sets a reset terminal R of the flip-flop 32c to a high level when receiving the active end signal ACTEZ or the burst end signal BSTEZ. The NOR gate 32b sets a set terminal S of the flip-flop 32c when both the internal chip enable signal CEX and the internal clock signal CLKZ are low. The flip-flop 32c is set to be low when receiving a high level at its set terminal S and is reset to be high when receiving a high level at its reset terminal R. In other words, the flip-flop 32c is set in synchronization with the first falling edge of the clock signal CLK after the chip enable signal /CE is activated to be low, and is reset in synchronization with completion of the operation of the memory core 42.

The NAND gate 32d sets a set terminal S of the flip-flop 32e in synchronization with a rising edge of the internal clock signal CLKZ during a period in which the flip-flop 32c outputs a low level (set period). The flip-flop 32e is set to be high when receiving a low level at its set terminal S, and is reset to be low when receiving a low level at its reset terminal R. In other words, the flip-flop 32e is set in synchronization with the first rising edge of the clock signal CLK after the chip enable signal /CE is activated to be low, and is reset in synchronization with completion of the operation of the memory core 42.

The timing generator 32f sets a node ND3 to a high level after a delay time of a delay circuit DLY from a falling edge of the internal chip enable signal CEX. That is, the timing generator 32f generates a delayed chip enable signal obtained by delaying the chip enable signal /CE by a predetermined time. The AND circuit 32g activates the address latch signal ALATZ during a period in which both the output of the flip-flop 32e (node ND2) and the output of the timing generator 32f (node ND3) are high.

Figure 3:
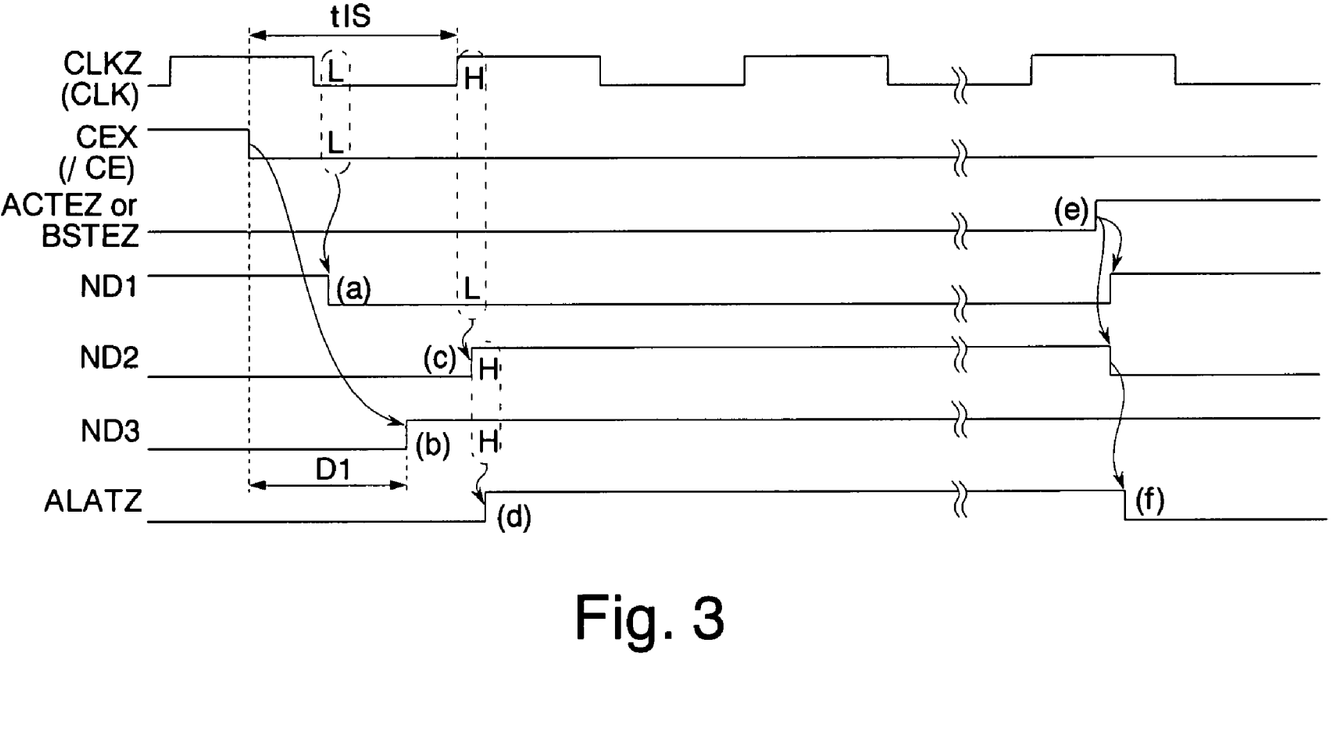
FIG. 3 is a timing chart showing an operation of the latch signal generator shown in FIG. 2.

FIG. 3 shows an operation of the latch signal generator 32 shown in FIG. 2. Waveforms in FIG. 3 show an example in which the chip enable signal /CE is input with set-up time tIS that is sufficient with respect to a rising edge of the clock signal CLK.

The level of the node ND1 that is the output of the flip-flop 32c shown in FIG. 2 changes to a low level when both the clock signal CLK and the chip enable signal /CE changed to be low ((a) in FIG. 3). The level of the node ND3 that is the output of the timing generator 32f changes to a high level after a predetermined time from the activation of the chip enable signal /CE ((b) in FIG. 3). The level of the node ND2 that is the output of the flip-flop 32e changes to a high level in synchronization with the first rising edge of the clock signal CLK after the chip enable signal /CE is activated ((c) in FIG. 3).

In the case where the set-up time tIS is longer than the delay time D1 of the delay circuit DLY, i.e., the set-up time tIS has margin, the transition timing to a high level of the node ND2 is behind that of the node ND31. Thus, the address latch signal ALATZ is activated in synchronization with the rising edge of the clock signal CLK ((d) in FIG. 3). Then, an access operation (read operation or write operation) is performed. The nodes ND1 and ND2 are reset in synchronization with the active end signal ACTEZ or the burst end signal BSTEZ output from the core control circuit 26 after the access operation ((e) in FIG. 3). The address latch signal ALATZ is deactivated in synchronization with the reset of the node ND2 ((f) in FIG. 3).

Figure 4:
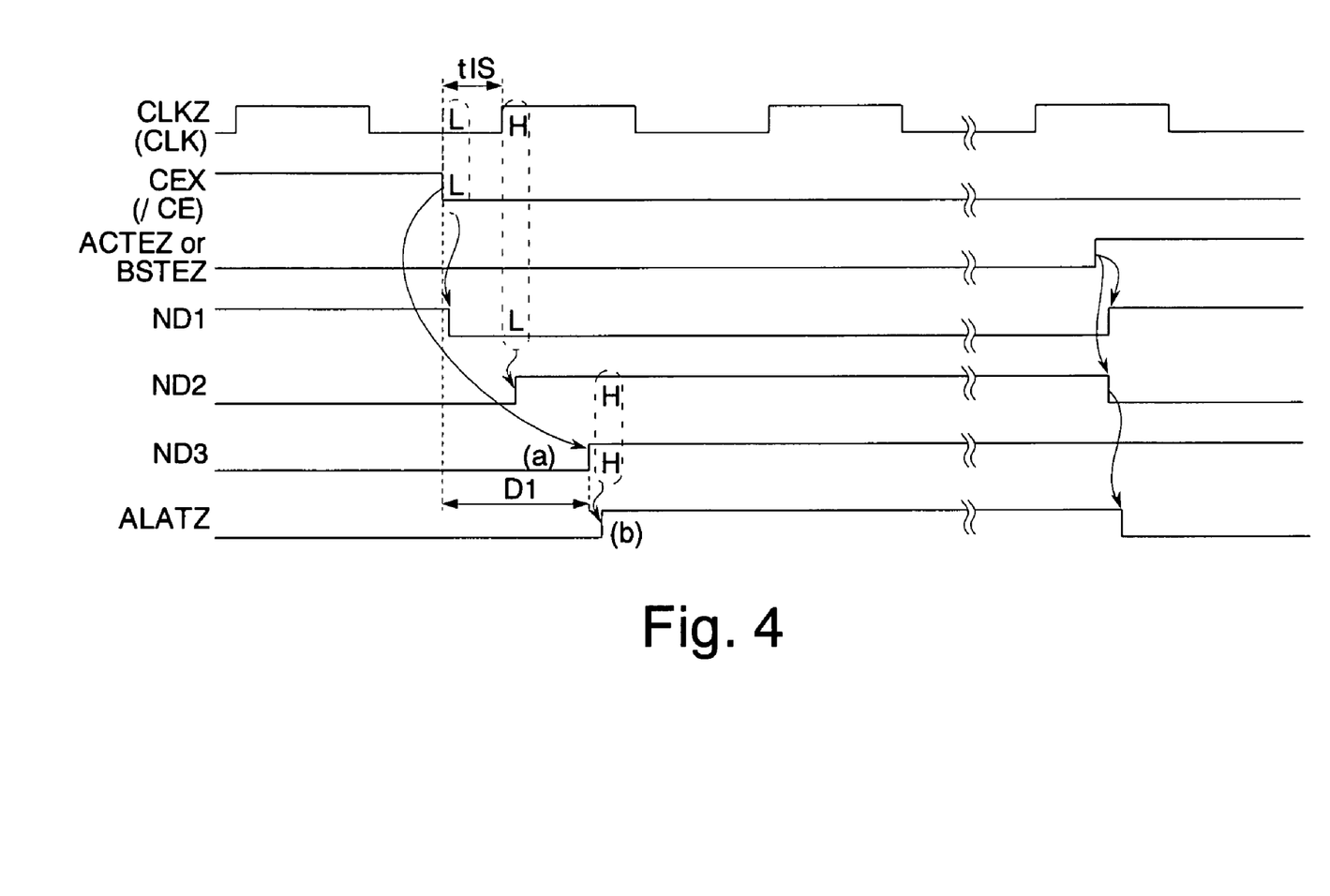
FIG. 4 is a timing chart showing another operation of the latch signal generator 32 shown in FIG. 2.

FIG. 4 shows another operation of the latch signal generator 32 shown in FIG. 2. In the description of FIG. 4, the same operations as those in FIG. 3 are not described in detail. Waveforms in FIG. 4 show an example in which the chip enable signal /CE which does not have the sufficient set-up time tIS with respect to a rising edge of the clock signal CLK is input.

In this example, the set-up time tIS does not have sufficient margin. Thus, the transition timing to a high level of the node ND3 is behind the rising edge of the clock signal CLK ((a) in FIG. 4). That is, the transition timing to a high level of the node ND3 is behind that of the node ND2. Therefore, the address latch signal ALATZ is not synchronized with the clock signal CLK. The address latch signal ALATZ is generated after a predetermined time from the activation of the chip enable signal /CE ((b) in FIG. 4).

In this manner, in the case where the set-up time tIS has sufficient margin, the address latch signal ALATZ is generated in synchronization with the clock signal CLK. On the other hand, in a case where the set-up time tIS has not sufficient margin, the address latch signal ALATZ is generated in synchronization with a signal obtained by delaying the chip enable signal /CE.

Figure 5:
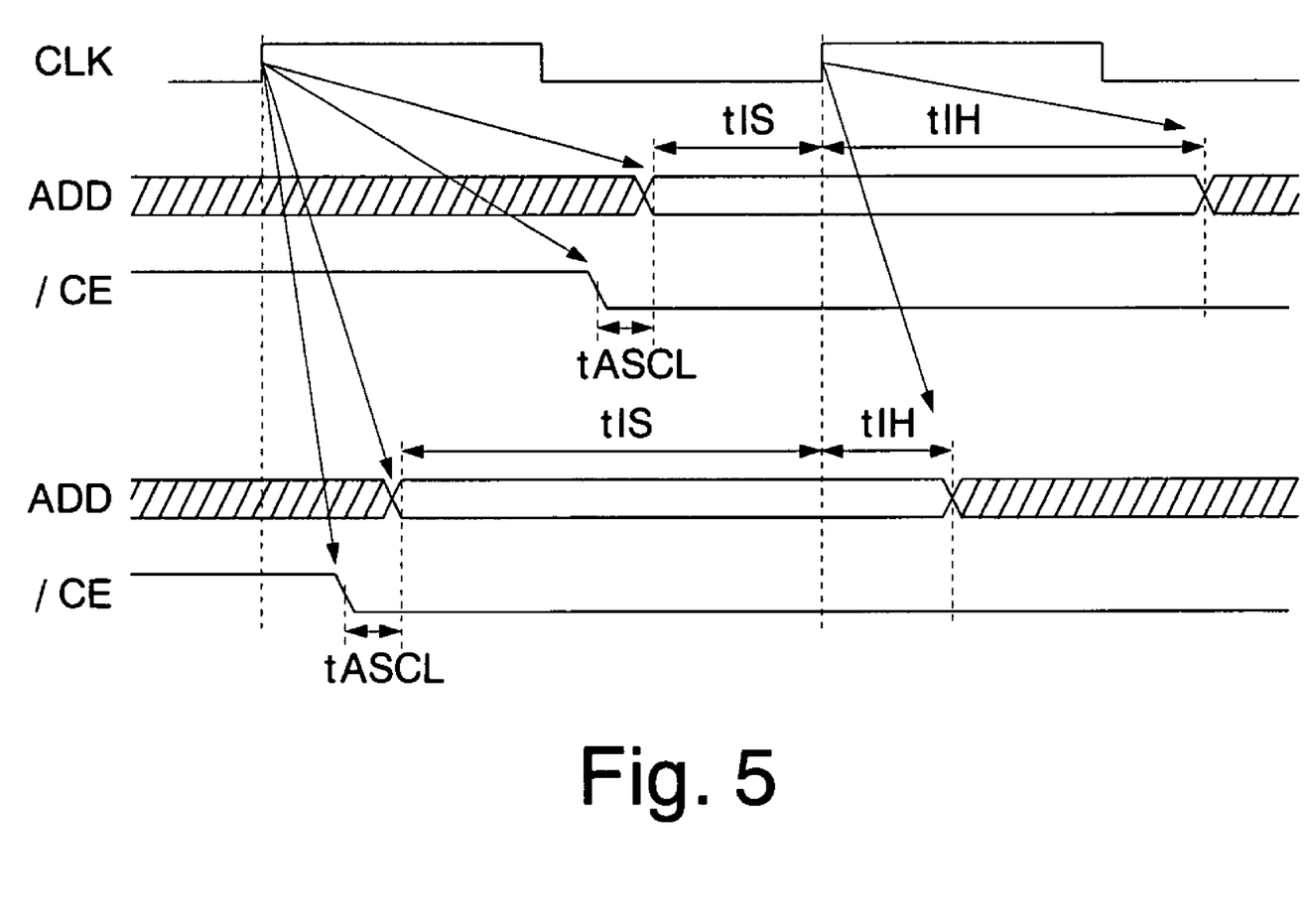
FIG. 5 is a timing chart showing changes of set-up time and hold time.

FIG. 5 shows changes of the set-up time tIS and hold time tIH. The set-up time tIS defines the minimum time in which the input signal is to be made valid before the rising of the clock signal CLK. The hold time tIH defines the minimum time in which the input signal is to be held after the rising of the clock signal CLK. The set-up time tIS and the hold time tIH are determined considering variation of characteristics of semiconductor devices occurring in a semiconductor fabrication process and the temperature and power supply voltage when the semiconductor device is operated, so as to surely take in the input signal even under the worst situation.

In general, a system (e.g., CPU) that accesses a semiconductor memory outputs a signal (ADD, /CE, or the like) that is supplied to a pseudo SRAM in synchronization with a rising edge of the clock signal CLK. A timing at which the signal output from the system reaches the pseudo SRAM is changed by driving performance of a circuit outputting that signal (a manufacturing error of device characteristics) and the power supply voltage and operating temperature of the system.

The valid period of the address signal ADD or the like is approximately equal to one clock cycle (tIS+tIH=one clock cycle) because such a signal is output in synchronization with the rising edge of the clock signal CLK. More specifically, the valid period becomes slightly shorter than one clock cycle because there are a transition edge time and a skew that is a time difference between bits. Thus, as a timing at which the address signal ADD reaches the pseudo SRAM is later, the set-up time tIS becomes shorter while the hold time tIH becomes longer. On the other hand, as the timing at which the address signal ADD reaches the pseudo SRAM is earlier, the set-up time tIS becomes longer while the hold time tIH becomes shorter.

The signal output from the system is supplied to the pseudo SRAM via a signal line formed in the system, such as a bus line. In general, the address signal ADD is supplied to a plurality of devices in the system in common. In this case, the load of the address signal ADD is larger than the load of the chip enable signal /CE. Thus, the address signal ADD reaches the pseudo SRAM later than the chip enable signal /CE in many cases. Taking the above fact into consideration, in the pseudo SRAM (including the pseudo SRAM of the present invention), it is permitted that the address signal ADD is input after a predetermined time tASCL from the timing at which the chip enable signal /CE is activated.

Figure 6:
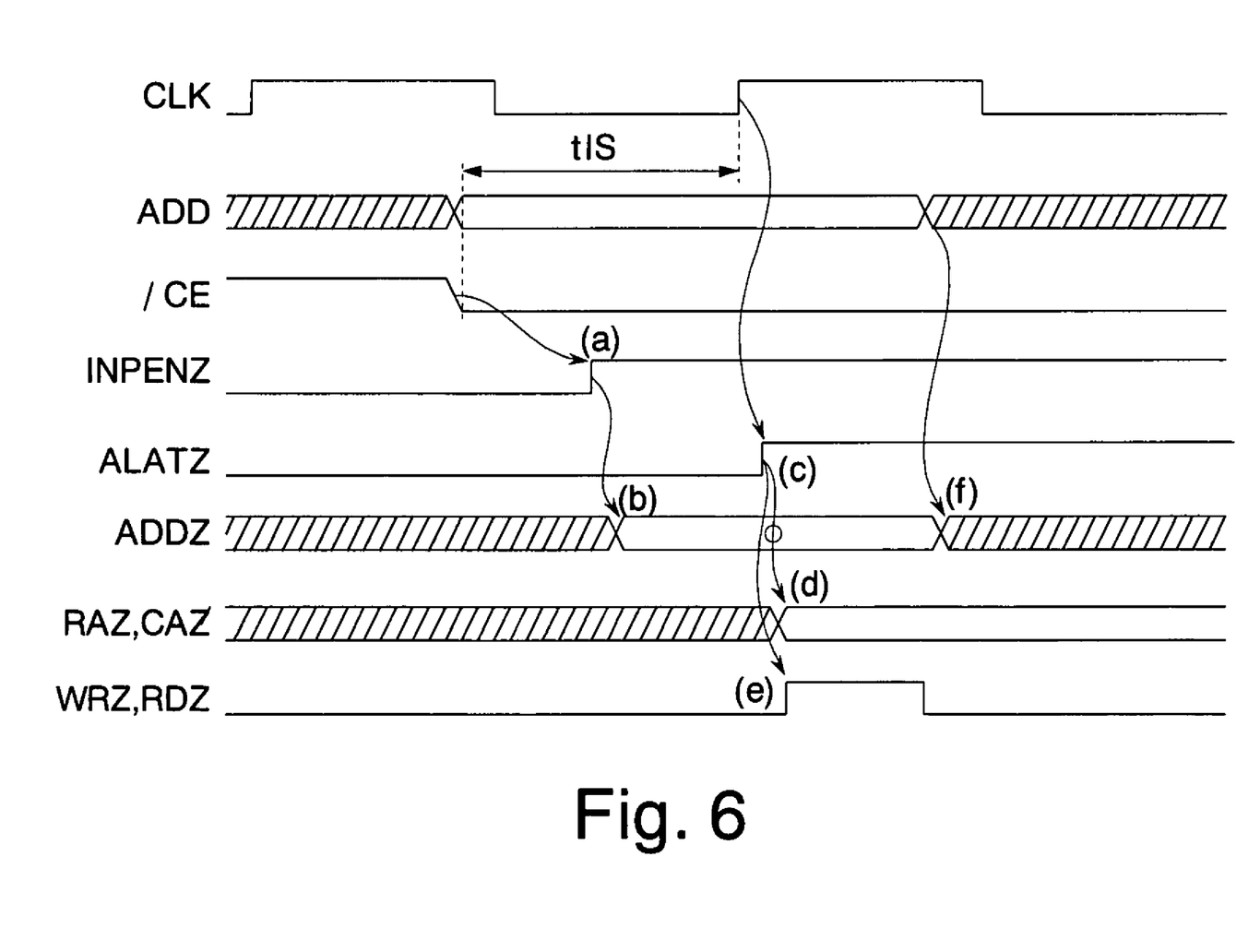
FIG. 6 is a timing chart showing an operation of a pseudo SRAM until an access operation starts.

FIG. 6 shows an operation of the pseudo SRAM until the access operation starts. Waveforms in FIG. 6 show an example in which the chip enable signal /CE is input with the set-up time tIS that is sufficient with respect to a rising edge of the clock signal CLK. A system for making an access to the pseudo SRAM supplies input signals such as the address signal ADD and the chip enable signal /CE, to the pseudo SRAM at the same timing. In fact, as shown in FIG. 5, the address signal ADD reaches the pseudo SRAM later than the chip enable signal /CE because of the load on the address signal line in the system.

The input buffer 16 shown in FIG. 1 activates the input enable signal INPENZ in synchronization with activation of the chip enable signal /CE ((a) in FIG. 6). The input buffer 18 receives the address signal ADD in synchronization with the input enable signal INPENZ ((b) in FIG. 6). Since the set-up time tIS has sufficient margin, the address latch signal ALATZ is generated in synchronization with a rising edge of the clock signal CLK ((c) in FIG. 6), as shown in FIG. 3. Then, the latch circuit 34 receives the internal address signal ADDZ with margin in synchronization with the address latch signal ALATZ, and outputs the received signal as the row address signal RAZ and the column address signal CAZ ((d) in FIG. 6). The command decoder 22 outputs the read control signal RDZ or the write control signal WRZ in synchronization with the address latch signal ALATZ ((e) in FIG. 6). As described above, the valid period of the address signal ADD is approximately equal to one clock cycle. Thus, during a period in which the input enable signal INPENZ is high, the internal address signal ADDZ changes with the change of the address signal ADD ((f) in FIG. 6).

Figure 7:
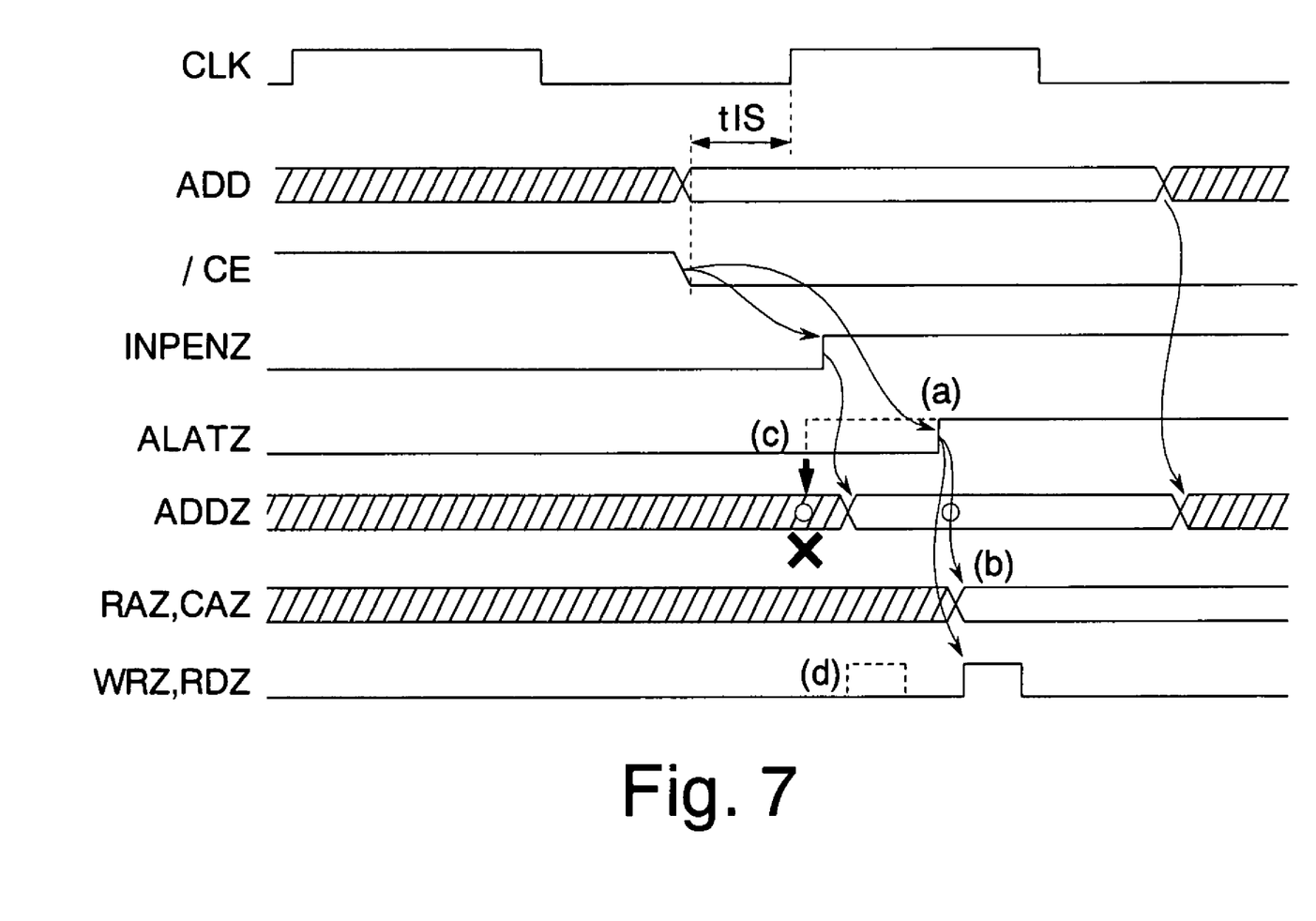
FIG. 7 is a timing chart showing another operation of the pseudo SRAM until the access operation starts.

FIG. 7 shows another operation of the pseudo SRAM until the access operation starts. In the description of FIG. 7, the same operations as those in FIG. 6 are not described in detail. Waveforms in FIG. 7 show an example in which the chip enable signal /CE which does not have the sufficient set-up time tIS with respect to a rising edge of the clock signal CLK is input. The timing at which the input enable signal INPENZ is activated with respect to the chip enable signal /CE is the same as that in the example of FIG. 6. Since the set-up time tIS does not have sufficient margin, the address latch signal ALATZ is generated by using a signal obtained by delaying the chip enable signal /CE ((a) in FIG. 7), as shown in FIG. 4. Then, the latch circuit 34 receives the internal address signal ADDZ with margin in synchronization with the address latch signal ALATZ, and outputs the received signal as the row address signal RAZ and the column address signal CAZ ((b) in FIG. 7).

Broken line in FIG. 7(c) shows a case where the address latch signal ALATZ is generated in synchronization with the clock signal CLK (i.e., the case where the present invention is not applied). When the address latch signal ALATZ is generated in synchronization with the clock signal CLK although the set-up time tIS does not have margin, the latch circuit 34 starts a latch operation before the address signal ADDZ becomes valid. In this case, the improper address signal ADDZ is latched, thus causing malfunction of the pseudo SRAM.

Broken line in FIG. 7(d) shows a case where the command decoder 22 is operated in synchronization with the clock signal CLK (i.e., the case where the present invention is not applied). In this case, a supply timing to the memory core 42 of the row address signal RAZ and that of a timing signal (not shown) generated by the core control circuit 26 are shifted from each other. In other words, the timing signal is supplied to the memory core 42 relatively earlier than the row address signal RAZ. This causes malfunction of the pseudo SRAM.

Figure 8:
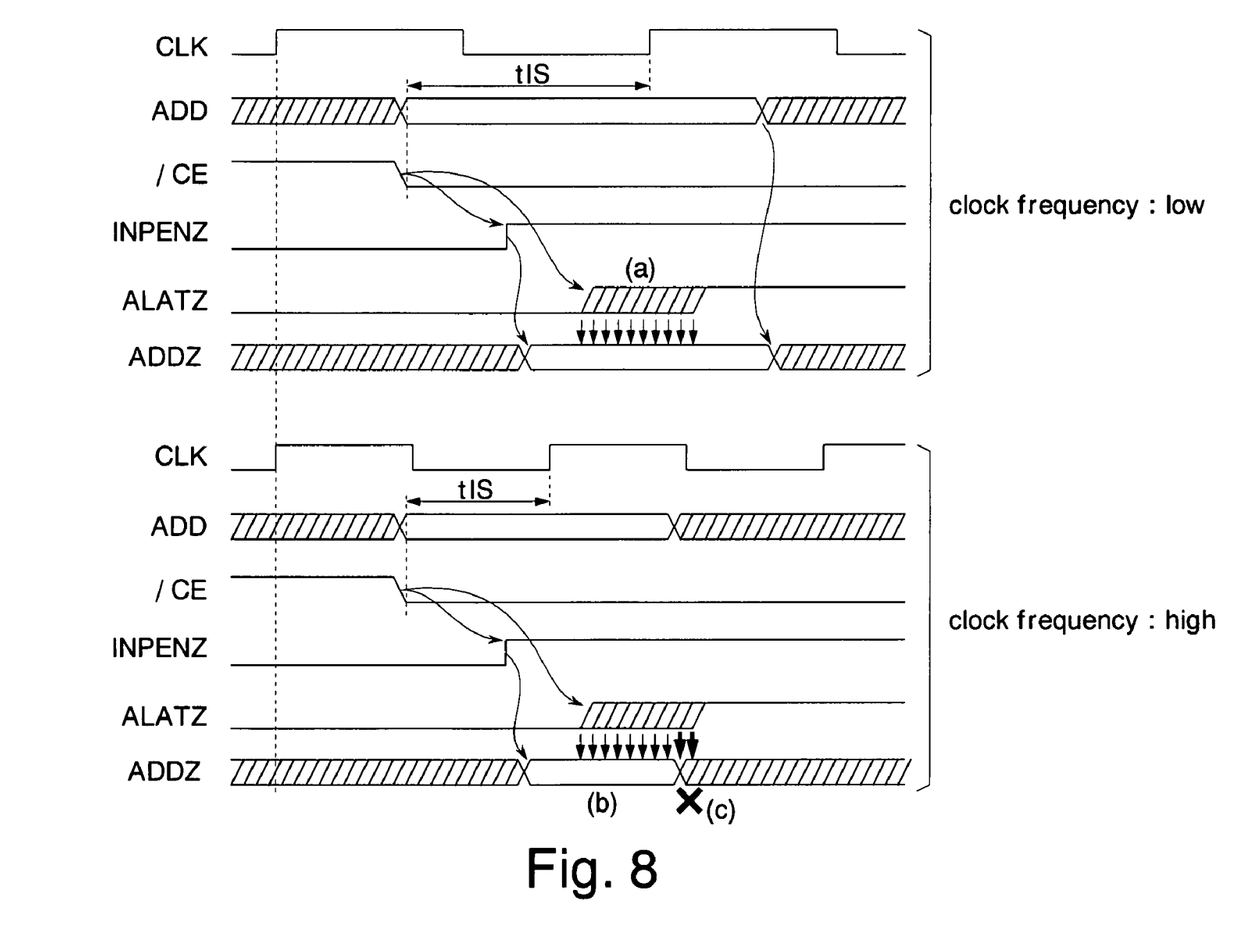
FIG. 8 is a timing chart showing a trouble of a pseudo SRAM to which the present invention is not applied.

FIG. 8 shows a trouble of the pseudo SRAM to which the present invention is not applied. In general, a generation timing of an internal signal in a semiconductor memory is changed by a change of driving performance of a transistor (a manufacturing error of device characteristics), a power supply voltage, and an operating temperature. Thus, an internal circuit of a pseudo SRAM is designed to surely latch the address signal ADD even in the case where a timing of the address latch signal ALATZ is changed by the timing change of the internal signal ((a) in FIG. 8).

On the other hand, in a case where a pseudo SRAM that generates the address latch signal ALATZ by using a signal obtained by delaying the chip enable signal /CE is modified to a clock synchronization-type, the valid period of the address signal ADD is approximately equal to one cycle of the clock signal CLK, as described with reference to FIG. 5. Thus, as the frequency of the clock signal CLK becomes higher, the valid period of the internal address signal ADDZ becomes shorter ((b) in FIG. 8). Therefore, as shown with bold arrow in FIG. 8, in the case where the generation timing of the address latch signal ALATZ is later, the proper internal address signal ADDZ cannot be latched, thus causing malfunction of the pseudo SRAM ((c) in FIG. 8). In order to prevent the malfunction of the pseudo SRAM, it is necessary to reduce the clock frequency. However, the reduction of the clock frequency prevents improvement of the performance of the pseudo SRAM.

According to the present invention, a signal generation path in the latch signal generator 32 that generates the address latch signal ALATZ is changed in accordance with the length of the set-up time tIS. Therefore, the aforementioned trouble can be prevented. More specifically, the latch signal generator 32 generates the address latch signal ALATZ in synchronization with the clock signal CLK when the set-up time tIS is long, and generates the address latch signal ALATZ in synchronization with the chip enable signal /CE when the set-up time tIS is short. Thus, it is possible to set the delay time (delay circuit DLY shown in FIG. 2) of the signal obtained by delaying the chip enable signal /CE, considering the case where the set-up time tIS is short only. Therefore, it is possible to generate the address latch signal ALATZ that can surely latch the internal address signal ADDZ.

As described above, according to the present embodiment, in the clock synchronization-type pseudo SRAM that controls the input buffer 18 for the address signal ADD by the input enable signal INPENZ, the address signal ADD can be surely latched even in the case where the set-up time tIS of the address signal ADD with respect to the clock signal CLK is short. Therefore, the stand-by current can be reduced, while the malfunction of the semiconductor memory caused by improper latch of the address signal ADD can be prevented.

The address signal ADD is latched in synchronization with a signal obtained by delaying the chip enable signal /CE when the set-up time tIS is short. Thus, also in the case where timing specification tASCL (i.e., delay time of the address signal ADD with respect to the chip enable signal /CE) is set considering the load on the signal line that transmits the address signal in a system including the pseudo SRAM (i.e., in the case where the substantial set-up time of the address signal ADD is short), the address signal ADD can be latched surely.

By operating the command decoder 22 in synchronization with the address latch signal ALATZ, the operation timing of the memory core 42 can be always coincident with a supply timing of an address signal that is supplied to the memory core 42 (i.e., address decoded signal) even if the activation timing of the address latch signal ALATZ is changed. Thus, it is possible to prevent malfunction caused by time lag between the signals supplied to the memory core 42.

In the above embodiment, the example has been described in which the present invention is applied to a clock synchronization-type pseudo SRAM. However, the present invention is not limited thereto. For example, the present invention may be applied to other clock synchronization-type semiconductor memories, such as a synchronous DRAM, a synchronous SRAM, and a synchronous flash memory.

In the above embodiment, the example has been described in which the present invention is applied to a pseudo SRAM chip. However, the present invention is not limited thereto. For example, the same effects can be also achieved when the present invention is applied to a pseudo SRAM core mounted on a system LSI.

The invention is not limited to the above embodiments and various modifications may be made without departing from the spirit and scope of the invention. Any improvement may be made in part or all of the components.

What is claimed is:

1. A semiconductor memory comprising:
   a memory core having a memory cell;
   a clock input buffer receiving a clock signal to operate an internal circuit;
   an enable input buffer receiving a chip enable signal which enables said memory core to operate;
   a signal input buffer which is activated to receive an input signal while said chip enable signal is active, and which is deactivated while said chip enable signal is not active;
   a latch signal generator generating a latch signal in synchronization with later one of a timing at which a delayed chip enable signal obtained by delaying said chip enable signal is activated and a transition timing of said clock signal received by said clock input buffer; and
   a latch circuit latching the input signal received by said signal input buffer in synchronization with said latch signal.

2. The semiconductor memory according to claim 1, wherein
   said signal input buffer is an address input buffer that receives an address signal indicating said memory cell to be accessed.

3. The semiconductor memory according to claim 2, comprising:
   a command input buffer receiving an access request for making an access to said memory core;
   a command decoder receiving and decoding said access request received by the command input buffer in synchronization with said latch signal, and outputting an operation control signal for operating said memory core; and
   a core control circuit accessing said memory core in response to the decoding result of said command decoder.

4. The semiconductor memory according to claim 1, comprising:
   a refresh timer generating in a predetermined cycle a refresh request to refresh said memory cell;
   a refresh counter sequentially generating a refresh address signal that indicates which of said memory cell is to be refreshed, in synchronization with said refresh request; and
   an arbiter determining, when said access request and said refresh request compete, which one of them is to be put before the other.

* * * * *